United States Patent [19]

Harashima et al.

[11] Patent Number: 5,677,824
[45] Date of Patent: Oct. 14, 1997

[54] ELECTROSTATIC CHUCK WITH MECHANISM FOR LIFTING UP THE PERIPHERAL OF A SUBSTRATE

[75] Inventors: Keiichi Harashima; Takeshi Akimoto, both of Tokyo, Japan

[73] Assignee: Nec Corporation, Tokyo, Japan

[21] Appl. No.: 755,551

[22] Filed: Nov. 22, 1996

[30] Foreign Application Priority Data

Nov. 24, 1995 [JP] Japan ................... 7-305354

[51] Int. Cl.$^6$ .................................. H02N 13/00
[52] U.S. Cl. .............. 361/234; 156/345; 118/723 R; 279/128
[58] Field of Search ............. 361/234; 279/128; 156/345; 118/723 R

[56] References Cited

U.S. PATENT DOCUMENTS 5,179,498  1/1993  Hongoh et al. ............... 361/234
5,569,350  10/1996  Osada et al. ................. 156/345
5,591,269  1/1997  Arami et al. ................. 118/723

FOREIGN PATENT DOCUMENTS 92-271286  9/1992  Japan.

*Primary Examiner*—Jeffrey A. Gaffin
*Assistant Examiner*—Thuy-Trang N. Huynh
*Attorney, Agent, or Firm*—Sughrue, Mion, Zinn, Macpeak & Seas, PLLC

[57] ABSTRACT

An electrostatic chuck applicable to, e.g., an epitaxial apparatus or an etching apparatus for electrostatically chucking a semiconductor substrate or wafer is disclosed. The chuck includes a stage for electrostatically retaining the wafer thereon. A plurality of lift pins are elevatable to thrust up the wafer. A plurality of release pins are arranged on the stage for thrusting up the peripheral portion of the wafer. A plurality of drive mechanisms respectively thrust up the release pins stepwise within the allowable elastic deformation range of the wafer. A control device selectively actuates the release pins via the associated drive mechanisms.

3 Claims, 3 Drawing Sheets

5,677,824

ELECTROSTATIC CHUCK WITH MECHANISM FOR LIFTING UP THE PERIPHERAL OF A SUBSTRATE

BACKGROUND OF THE INVENTION

The present invention relates to an electrostatic chuck applicable to, e.g., an epitaxial apparatus or an etching apparatus for electrostatically chucking a semiconductor substrate.

In a plasma etching apparatus, for example, a semiconductor substrate, or wafer as referred to hereinafter, has its peripheral portion mechanically held by a clamper or has its rear electrostatically held on a stage during plasma etching. In recent years, the electrostatic holding scheme is replacing the mechanical clamping scheme because it insures close contact between the wafer and the stage and thereby enhances wafer cooling efficiency. In addition, because the electrostatic holding scheme does not have to clamp the wafer, it allows the entire wafer to be etched and thereby increases chip packaging density.

A conventional electrostatic chuck for the above application includes a stage formed of an insulating material and having an electrode buried therein. When a DC voltage is applied from a DC power source to the electrode, the stage electrostatically holds a wafer thereon. A plurality of lift pins are selectively raised or lowered by an elevating mechanism. The lift pins thrust up, when raised, the wafer released from the electrostatic retention of the stage. To release the wafer from the chuck, the power source stops applying the DC voltage to the electrode. Then, a discharging sequence is executed in order to discharge the rear of the charged wafer. Thereafter, the lift pins are raised at the same time in order to push up the wafer away from the stage. Subsequently, a fork which is a specific form of a conveyor is inserted between the wafer and the fork, and then the lift pins are lowered. As a result, the wafer is laid on the fork and conveyed to the outside of a reaction chamber by the fork.

However, the conventional chuck has a problem that the discharging sequence is sometimes defective, depending on the condition of the rear of the wafer, the amount of residual charge, the varying atmosphere and wall conditions of the reaction chamber, etc. When the charge or electrostatic holding force remains on the entire area of or locally on the wafer, the wafer cannot be smoothly released from the surface of the stage. As a result, the wafer is apt to spring up when released, to fail to accurately rest on the fork, or even to drop due to vibration and crack. This is particularly true with recent wafers having diameters as great as 8 inches and 12 inches. This is because the force acting between each lift pin and the wafer at the time of release increases with an increase in the diameter of the wafer.

SUMMARY OF THE INVENTION

It is therefore an object of the present invention to provide an electrostatic chuck capable of releasing a wafer from a stage smoothly even when charge or electrostatic holding force remains on the wafer.

An electrostatic chuck of the present invention includes a stage for electrostatically retaining the wafer thereon. A plurality of lift pins are elevatable to thrust up the wafer. A plurality of release pins are arranged on the stage for thrusting up the peripheral portion of the wafer. A plurality of drive mechanisms respectively thrust up the release pins stepwise within the allowable elastic deformation range of the wafer. A control device selectively actuates the release pins via the associated drive mechanisms.

BRIEF DESCRIPTION OF THE DRAWINGS

The above and other objects, features and advantages of the present invention will become apparent from the following detailed description taken with the accompanying drawings in which.

In the figures, identical reference numerals designate identical structural elements.

DESCRIPTION OF THE PREFERRED EMBODIMENTS

Figure 1:
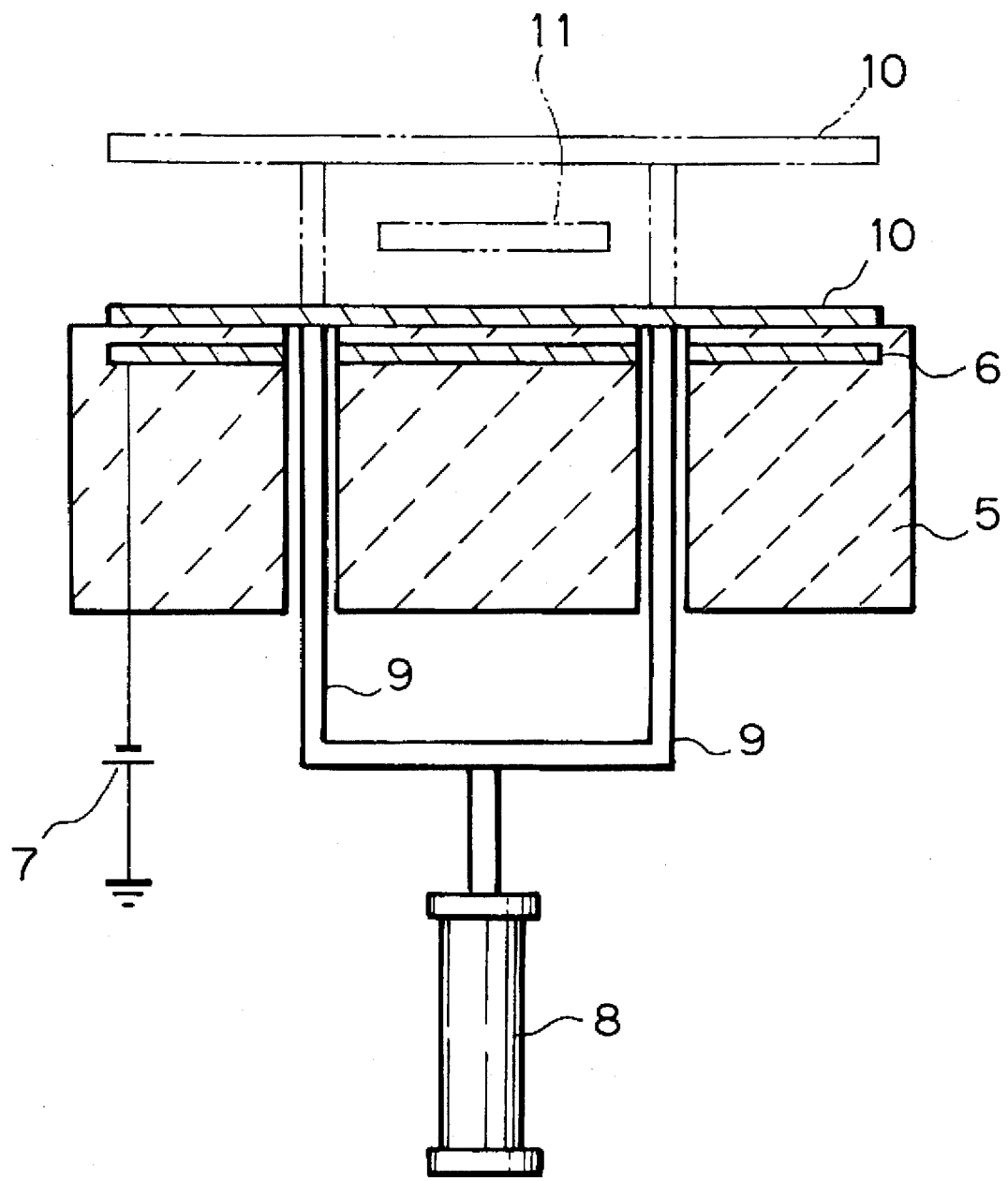
FIG. 1 is a section showing a conventional electrostatic chuck.

To better understand the present invention, a brief reference will be made to a conventional electrostatic chuck, shown in FIG. 1. As shown, the chuck has a stage 5 formed of an insulating material. An electrode 6 is buried in the stage 5. When a DC voltage is applied from a DC power source 7 to the electrode 6, the stage 5 electrostatically holds a wafer 10 thereon. A plurality of lift pins 9 are selectively raised or lowered by an elevating mechanism 8. The lift pins 9 thrust up, when raised, the Wafer 10 released from the electrostatic retention of the stage 5.

To release the wafer 10 from the chuck, the power source 7 stops applying the DC voltage to the electrode 6. Then, a discharging sequence is executed in order to discharge the rear of the charged wafer 10. At this instant, power applied from a high-frequency power source, not shown, may be sequentially lowered with discharge being effected. To release the wafer 10 from the stage 5 more positively, a voltage opposite in polarity to the holding voltage may be applied to the wafer 10 or between electrodes so as to sequentially dissipate the charge. After the discharging sequence, the lift pins 9 are raised at the same time in order to push up the wafer 10 away from the stage 5, as indicated by dash-and-dots lines in FIG. 1. Subsequently, a fork 11 which is a specific form of a conveyor is inserted between the wafer 10 and the stage 5, and then the lift pins 9 are lowered. As a result, the wafer 10 is laid on the fork 11 and conveyed to the outside of a reaction chamber by the fork 11. Usually, the chuck has three or four lift pins 9.

The above conventional chuck has some problems yet unsolved, as discussed earlier.

Figure 2A:
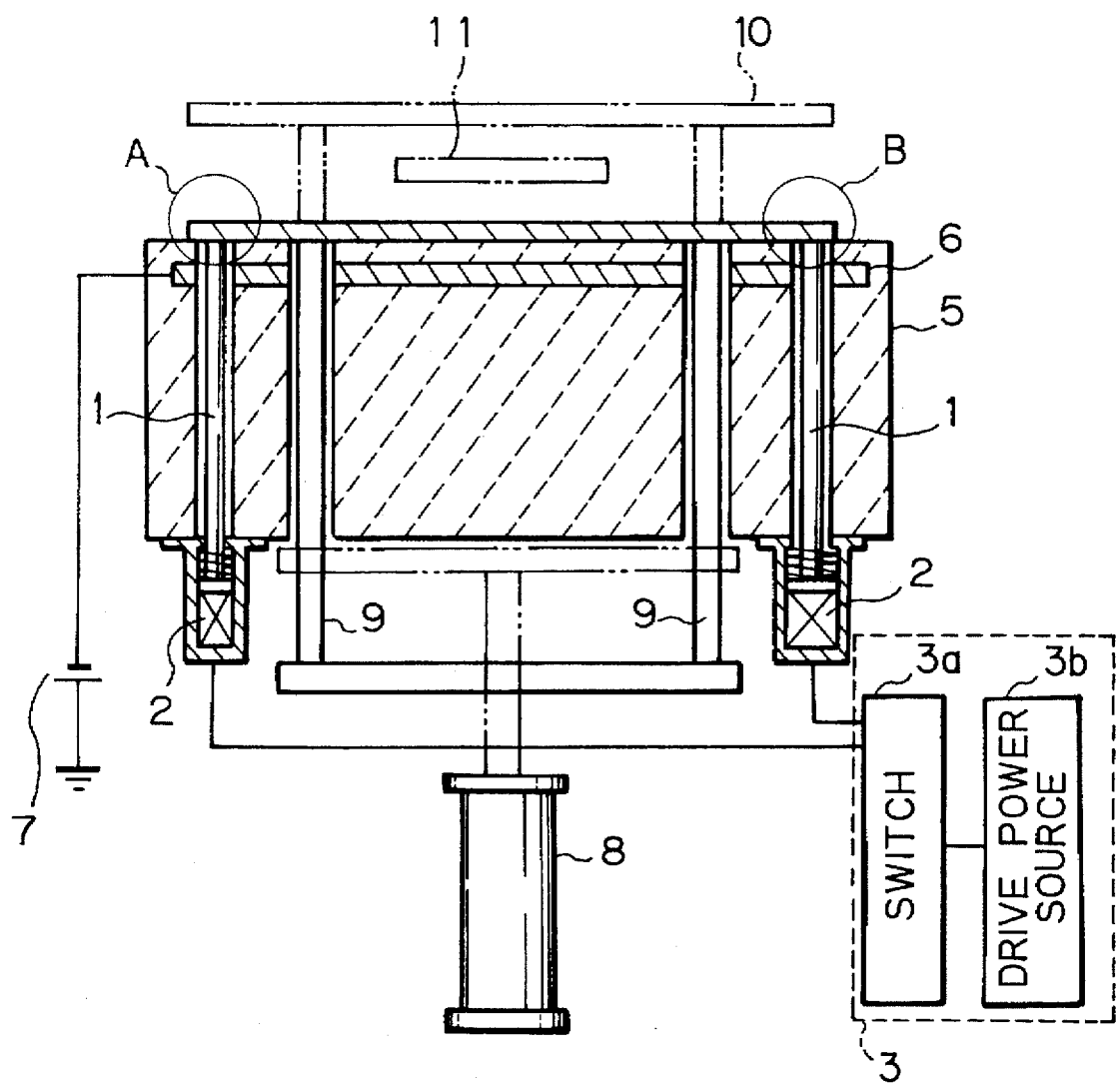
FIG. 2A is a section showing an electrostatic chuck embodying the present invention.
Figure 2B:
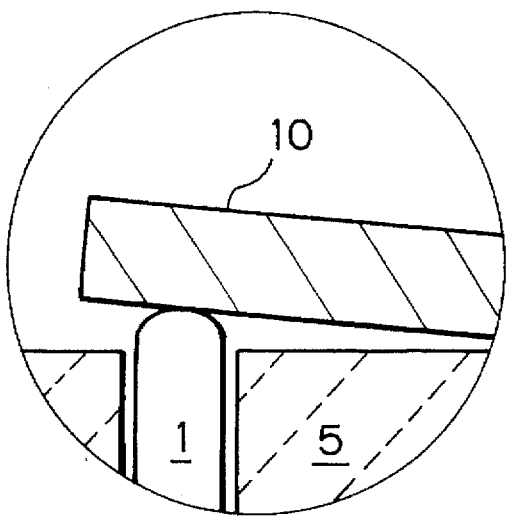
FIG. 2B is an enlarged view of a portion A shown in FIG. 2A.
Figure 2C:
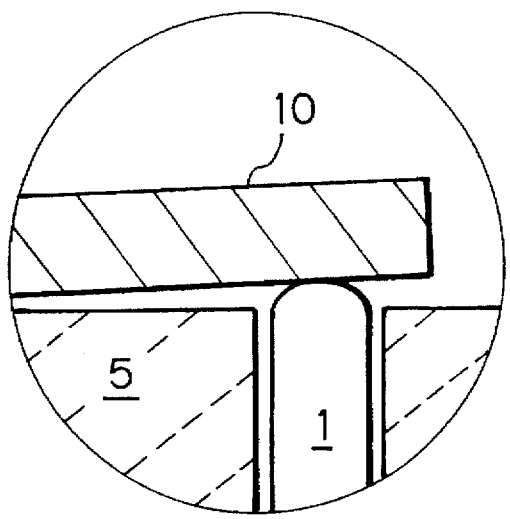
FIG. 2C is an enlarged view of a portion B shown in FIG. 2A.

Referring to FIGS. 2A, 2B and 2C, an electrostatic chuck embodying the present invention will be described. As shown in FIG. 2A, the chuck has a stage 5 including a plurality of release pins 1. The release pins 1 are so positioned on the stage 5 as to push up the peripheral portion of the rear of a wafer 10. Drive mechanisms 2 each causes the respective release pin 1 to push up the wafer 10 stepwise within the allowable elastic deformation range of the wafer 10. A control device 3 selectively actuates the drive mechanisms 2, as will be described specifically later. As for the rest of the construction, the illustrative embodiment is identical with the conventional chuck.

Four to ten release pins 1, for example, are arranged on a single circle so as to push up the water 10 evenly. The circle on which the release pins 1 are arranged surrounds lift pins 9. The drive mechanisms 2 for pushing up the associated release pins 1 stepwise are each implemented as a stack of electrostrictive elements for pushing the rear end of the respective pin 1. One end of each drive mechanism 2 contacts the rear end of the respective pin 1 while the other end contacts the bottom of a receptacle accommodating the mechanism 2. A compression spring constantly biases each pin 1 downward. When a voltage is not applied to the electrostrictive stack of the drive mechanism 2, the front end of the pin 1 remains flush with or slightly downward of the surface of the stage 5 for holding the wafer 10.

The control device 3 has a switch or selector 3a and a drive power source 3. The switch 3a selects the drive mechanisms 2 to be actuated while the drive power source 3b applies a voltage to the drive mechanisms 2 selected by the switch 3a. The control device 3 causes the drive mechanisms 2 to selectively operate via the switch 3a and thereby allows a force to act on the wafer 10 more uniformly. Further, even when the electrostatic holding force remains over the entire area of the wafer 10, the force acting between each release pin 1 and the wafer 10 is successfully reduced to one-seventh or so, compared to the case wherein only three or four lift pins exist. This flees the wafer 10 from warping and therefore springing back due to the local concentration of the force.

Each drive mechanism 2 has a stack of five electrostrictive elements by way of example. When, a voltage is applied to one of the five electrostrictive elements, the stack raises the associated release pin 1 by bout 0.1 mm. That is, when a voltage is applied to the five electrostrictive elements at the same time, the stack raises the pin 1 by 0.5 mm. Why the maximum rise of the pin 1 is selected to be 0.5 mm is that the allowable range of elastic deformation of a 6-inch wafer and which does not cause such a wafer to crack is about 0.6 mm. Of course, when it comes to an 8-inch or 10-inch wafer, the pin 1 will not cause the wafer to crack when raised to the above maximum distance, although causing the wafer to deform.

How the embodiment releases the wafer 10 from the stage 5 will be described hereinafter. Assume that four release pins 1 are arranged on a single circle in order to facilitate an understanding of the embodiment. First, the control device 3 operate a first group of two drive mechanisms 2 assigned to two release pins 1 facing each other in the radial direction of the wafer 10. In response, the two drive mechanisms 2 raise the associated release pins by about 0.1 mm. As shown in FIG. 2B, the pin 1 located at a position where the residual holding force is weak can push up the wafer 10 away from the stage 5 easily. However, as shown in FIG. 2C, the pin 1 sometimes fails to release the wafer 10 from the stage 5. Even in the condition shown in FIG. 2C, the control device 3 executes the next step, as follows.

The control device 3 operates a second group of two drive mechanisms 2 corresponding to the other two release pins 1 facing each other and spaced from the first group of pins 1 by 90 degrees. In response, the drive mechanisms 2 belonging to the second group raise the associated release pins 1 by about 0.1 mm. Subsequently, the control device 3 further raises, whether or not the wafer 10 may have been released from the stage 5, the first pins 1 raised by 0.1 mm previously. Such a procedure is repeated until the pins 1 have been raised by 0.5 mm at maximum. As a result, the wafer 10 can be released from the stage 5 even when residual charge exists. This was confirmed by a series of experiments. In the above condition, the lift pins 9 are raised, and then a fork 11 is inserted between the wafer 10 and the stage 5. Subsequently, the lift pins 9 are lowered so as to lay the wafer 10 on the fork 11.

Figure 3:
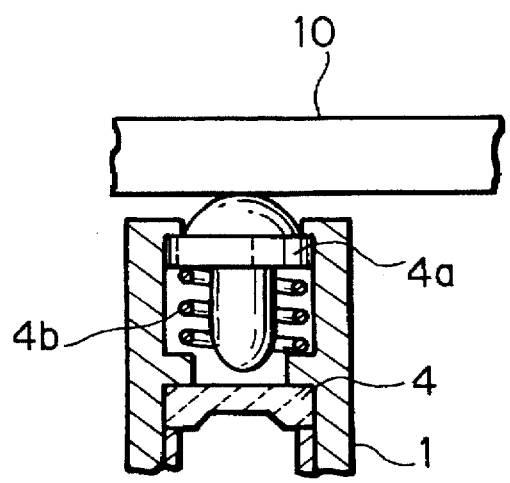
FIG. 3 is a section showing an alternative embodiment of the present invention.

FIG. 3 shows one of the release pins 1 which is representative of an alternative embodiment of the present invention. This embodiment differs from the previous embodiment in that the release pin 1 includes a pressure sensor 4 therein. The pressure sensor 4 contacts the wafer 10 in order to sense a pressure acting between the pin 1 and the wafer 10. Specifically, a spring 4b is loaded in the front end of the pin 1 and constantly biases a contact member 4a such that the member 4a partly protrudes from the front end of the pin 1. The sensor 4 contacts the rear end of the contact member 4a. Assume that the pin 1 contacts the wafer 10, as shown in FIG. 2A. Then, the sensor 4 senses a residual electrostatic holding force in terms of contact pressure. When the residual holding force becomes zero, the sensor 4 determines that the wafer 10 has been released from the stage 5.

For example, assume that the retaining force acting between a single release pin 1 and the wafer 10 due to the residual charge is 50 g/cm$^2$. Then, in the condition shown in FIG. 2C, the output of the sensor 4 detected every 0.1 mm is about 50 g/cm$^2$. However, as the pin 1 is repeatedly raised stepwise, the wafer 10 is released from the stage 5, as shown in FIG. 2B. If the pin 1 facing the above pin 1 has also released the wafer 10 from the stage 5, then the sensor 4 is expected to show a pressure derived from the weight of the wafer 10. If the pin facing the above pin 1 has not released the wafer 10 from the stage 5, then the sensor 4 is expected to show a medium pressure of, e.g., 25 g/cm$^2$ even in the released condition shown in FIG. 2B.

As stated above, the alternative embodiment controls the stepwise elevation of the release pins 1 adequately in accordance with the outputs of the associated pressure sensors 4. This makes it possible to determine, before all the release pins 1 have been elevated by 0.5 mm as in the previous embodiment, whether or not the wafer 10 has been released from the stage 5.

In summary, it will be seen that the present invention provides an electrostatic chuck capable of releasing a wafer from a stage by thrusting up the peripheral portion of the wafer evenly little by little. This prevents the wafer from dropping due to its spring-back and being damaged and conveyed defectively thereby.

Various modifications will become possible for those skilled in the art after receiving the teachings of the present disclosure without departing from the scope thereof.

What is claimed is:

1. An electrostatic chuck comprising:

a stage for electrostatically retaining a semiconductor substrate thereon;

a plurality of lift pins elevatable to thrust up the semiconductor substrate;

a plurality of release pins arranged on said stage for thrusting up a peripheral portion of the semiconductor substrate;

a plurality of drive mechanisms for respectively thrusting up said plurality of release pins stepwise within an allowable elastic deformation range of the semiconductor substrate; and a control device for selectively actuating said plurality of drive mechanisms.

2. A chuck as claimed in claim 1, wherein said plurality of drive mechanisms each comprises a stack of electrostrictive elements.

3. A chuck as claimed in claim 1, further comprising a plurality of pressure sensors each being mounted on a tip portion of the respective release pin, for sensing a contact pressure acting between said respective release pin and the semiconductor substrate.

* * * * *